(12) United States Patent
Boles et al.

(10) Patent No.: US 12,074,225 B2
(45) Date of Patent: Aug. 27, 2024

(54) PIN DIODES WITH MULTI-THICKNESS INTRINSIC REGIONS

(71) Applicant: MACOM Technology Solutions Holdings, Inc., Lowell, MA (US)

(72) Inventors: Timothy Edward Boles, Tyngsboro, MA (US); James Joseph Brogle, Merrimac, MA (US); Joseph Gerard Bukowski, Derry, NH (US); Margaret Mary Barter, Lowell, MA (US)

(73) Assignee: MACOM TECHNOLOGY SOLUTIONS HOLDINGS, INC., Lowell, MA (US)

( * ) Notice: Subject to any disclaimer, the term of this patent is extended or adjusted under 35 U.S.C. 154(b) by 0 days.

(21) Appl. No.: 17/289,990

(22) PCT Filed: Dec. 2, 2019

(86) PCT No.: PCT/US2019/064018
§ 371 (c)(1),
(2) Date: Apr. 29, 2021

(87) PCT Pub. No.: WO2020/117679
PCT Pub. Date: Jun. 11, 2020

(65) Prior Publication Data
US 2021/0399143 A1    Dec. 23, 2021

Related U.S. Application Data

(60) Provisional application No. 62/774,577, filed on Dec. 3, 2018.

(51) Int. Cl.
*H01L 29/868* (2006.01)
*H01L 21/265* (2006.01)
(Continued)

(52) U.S. Cl.
CPC ...... *H01L 29/868* (2013.01); *H01L 21/26513* (2013.01); *H01L 29/0688* (2013.01); *H01L 29/6609* (2013.01)

(58) Field of Classification Search
None
See application file for complete search history.

(56) References Cited

U.S. PATENT DOCUMENTS

| 3,217,212 A | 11/1965 | Ryder |
| 4,074,303 A | 2/1978 | Benda et al. |

(Continued)

FOREIGN PATENT DOCUMENTS

| CN | 105049015 A | 11/2015 |
| CN | 105932023 A | 9/2016 |

(Continued)

OTHER PUBLICATIONS

International Search Report and Written Opinion mailed on Jun. 8, 2020 for PCT Patent Application No. PCT/US2020/017945.
(Continued)

*Primary Examiner* — Xiaoming Liu
(74) *Attorney, Agent, or Firm* — Perilla Knox & Hildebrandt LLP; Jason M. Perilla

(57) ABSTRACT

A monolithic, vertical, planar semiconductor structure with a number diodes having different intrinsic regions is described. The diodes have intrinsic regions of different thicknesses as compared to each other. In one example, the semiconductor structure includes an N-type silicon substrate, an intrinsic layer formed on the N-type silicon substrate, and a dielectric layer formed on the intrinsic layer. A number of openings are formed in the dielectric layer. Multiple anodes are sequentially formed into the intrinsic layer through the openings formed in the dielectric layer. For example, a first P-type region is formed through a first one (Continued)

the openings to a first depth into the intrinsic layer, and a second P-type region is formed through a second one of the openings to a second depth into the intrinsic layer. Additional P-type regions can be formed to other depths.

20 Claims, 8 Drawing Sheets

(51) Int. Cl.
*H01L 29/06* (2006.01)
*H01L 29/66* (2006.01)

(56) References Cited

U.S. PATENT DOCUMENTS

| | | | |
|---|---|---|---|
| 4,180,422 A * | 12/1979 | Rosvold | H01L 29/868 257/E29.022 |
| 4,452,646 A | 6/1984 | Zuleeg | |
| 4,476,481 A | 10/1984 | Iesaka et al. | |
| 4,587,547 A | 5/1986 | Amemiya et al. | |
| 4,672,402 A | 6/1987 | Yamaoka et al. | |
| 4,673,958 A | 6/1987 | Bayraktaroglu | |
| 4,777,490 A | 10/1988 | Sharma et al. | |
| 4,843,358 A | 6/1989 | Meise et al. | |
| 5,047,829 A | 9/1991 | Seymour et al. | |
| 5,107,318 A * | 4/1992 | Makiuchi | H01L 27/1443 257/E27.128 |
| 5,126,701 A | 6/1992 | Adlerstein | |
| 5,401,984 A | 3/1995 | Byatt et al. | |
| 5,438,213 A | 8/1995 | Tailliet | |
| 5,612,564 A | 3/1997 | Fujishima et al. | |
| 5,633,515 A | 5/1997 | Gantioler et al. | |
| 6,552,626 B2 | 4/2003 | Sharpe et al. | |
| 6,821,860 B1 | 11/2004 | Behammer | |
| 7,129,805 B2 | 10/2006 | Marion et al. | |
| 7,671,379 B2 | 3/2010 | Goerlach | |
| 7,755,173 B2 | 7/2010 | Mondi et al. | |
| 11,127,737 B2 | 9/2021 | Brogle et al. | |
| 11,574,906 B2 | 2/2023 | Brogle et al. | |
| 11,705,448 B2 | 7/2023 | Brogle et al. | |
| 2003/0116777 A1 | 6/2003 | Yu | |
| 2004/0135235 A1 | 7/2004 | Poveda | |
| 2004/0235549 A1 | 11/2004 | Struble et al. | |
| 2005/0077577 A1 | 4/2005 | Manna et al. | |
| 2005/0242412 A1 | 11/2005 | Gabl | |
| 2007/0077725 A1 | 4/2007 | Wilson et al. | |
| 2007/0166942 A1 | 7/2007 | Cogan et al. | |
| 2008/0191306 A1 | 8/2008 | Goerlach | |
| 2008/0296587 A1 * | 12/2008 | Yamamoto | H01L 29/872 257/77 |
| 2008/0310066 A1 | 12/2008 | Bobde | |
| 2009/0230516 A1 | 9/2009 | Goodrich et al. | |
| 2010/0097120 A1 | 4/2010 | Bizien et al. | |
| 2010/0117725 A1 * | 5/2010 | Mauder | H01L 29/861 257/656 |
| 2010/0164068 A1 | 7/2010 | Pennock | |
| 2010/0208517 A1 | 8/2010 | Lo et al. | |
| 2010/0308429 A1 | 12/2010 | Ma et al. | |
| 2013/0153916 A1 | 6/2013 | Weyers et al. | |
| 2014/0070369 A1 * | 3/2014 | Kitamura | H01L 29/861 438/542 |
| 2016/0099306 A1 | 4/2016 | Cheng | |
| 2017/0317075 A1 | 11/2017 | Arai et al. | |
| 2020/0127023 A1 | 4/2020 | Geske et al. | |
| 2020/0258883 A1 | 8/2020 | Brogle et al. | |
| 2020/0279844 A1 | 9/2020 | Brogle et al. | |
| 2021/0343706 A1 | 11/2021 | Brogle et al. | |
| 2021/0399143 A1 | 12/2021 | Boles et al. | |

FOREIGN PATENT DOCUMENTS

| | | | | |
|---|---|---|---|---|
| CN | 206658190 U | | 11/2017 | |
| DE | 4407279 C1 | | 10/1994 | |
| DE | 19726070 A1 | | 12/1998 | |
| EP | 1605508 A2 * | | 12/2005 | H01L 27/0248 |
| EP | 2940782 A1 | | 11/2015 | |
| JP | S57128983 A | | 8/1982 | |
| WO | 2020117679 A1 | | 6/2020 | |
| WO | 20200167961 A1 | | 8/2020 | |
| WO | 2020176878 A1 | | 9/2020 | |

OTHER PUBLICATIONS

Rao, M. V.; et al. "Characteristics of fully implanted GaAs vertical PIN diodes." Solid-State Electronics 41.1 (1997): 47-50.

International Search Report and Written Opinion dated May 28, 2020 for PCT Patent Application No. PCT/US2020/020471.

International Search Report for PCT/US2019/064018 mailed Feb. 27, 2020.

James J Brogle et al: "A 50 watt monolithic surface-mount series-shunt PIN diode switch with integrated thermal sink", Microwave Conference Proceedings (APMC), 2010 Asia-Pacific, IEEE, Dec. 7, 2010 (Dec. 7, 2010), pp. 1739-1742, XP031928657, ISBN: 978-1-4244-7590-2 abstract; figure 1.

Boles Timothy et al: "Monolithic High Power 300 Watt, S-Band, HMIC PIN Diode Limiter", 2019 IEEE International Conference on Microwaves, Antennas, Communications and Electronic Systems (COMCAS), IEEE, Nov. 4, 2019 (Nov. 4, 2019), pp. 1-5, XP033690466, DOI: 10.1109/COMCAS44984.2019.8958017 [retrieved on Jan. 13, 2020] figures 4, 5.

Final Office Action from U.S. Appl. No. 16/805,154 mailed Jun. 24, 2022.

Non-Final Office Action for U.S. Appl. No. 16/805,154 dated Feb. 25, 2022.

Non-Final Office Action for U.S. Appl. No. 18/306,342 dated Jan. 19, 2024.

Non-Final Office Action for U.S. Appl. No. 18/151,824 mailed May 23, 2024.

* cited by examiner

PIN DIODES WITH MULTI-THICKNESS INTRINSIC REGIONS

CROSS-REFERENCE TO RELATED APPLICATIONS

This application is a 35 U.S.C. § 371 National Stage Patent Application of Patent Cooperation Treaty Application number PCT/US2019/064018, filed on Dec. 2, 2019, and titled "PIN DIODES WITH MULTI-THICKNESS INTRINSIC REGIONS," which claims the benefit of priority to U.S. Provisional Application No. 62/774,577, filed Dec. 3, 2018, titled "PIN DIODES WITH MULTI-THICKNESS INTRINSIC REGIONS," the entire contents of both of which applications are hereby incorporated herein by reference.

BACKGROUND

Traditionally, PIN (p-type-intrinsic-n-type) diodes are fabricated by the growth, deposition, or other placement of layers vertically on a substrate. A PIN diode is a diode with an undoped intrinsic semiconductor region between a P-type semiconductor region and an N-type semiconductor region. The P-type and N-type regions are typically heavily doped because they are used for ohmic contacts. The inclusion of the intrinsic region between the P-type and N-type regions is in contrast to an ordinary PN diode, which does not include an intrinsic region.

The top, P-type region is the anode of the PIN diode, and the bottom, N-type region or substrate is the cathode of the PIN diode. When unbiased, the PIN diode is in a high impedance state and can be represented as a capacitor, the capacitance of which is given by $C = A_{Anode} D_{si} E_o / T$, where: $A_{Anode}$ is the area of the anode, $D_{si}$ is the dielectric constant of the intrinsic silicon, $E_o$ is the permittivity of free space, and T is the distance between the anode and cathode.

If a positive voltage larger than a threshold value is applied to the anode with respect to the cathode, a current will flow through the PIN diode and the impedance will decrease. A PIN diode in a forward biased state can be represented as a resistor whose value decreases to a minimum value as the current through the PIN diode increases. The bias to change the PIN diode from the high impedance (off) state to the low impedance (on) state can be DC or AC. In the case of an AC voltage, the magnitude must be greater than the threshold value and the duration of the positive voltage must be longer than the transit time of carriers across the intrinsic region.

SUMMARY

A monolithic, vertical, planar semiconductor structure with a number diodes having different intrinsic regions is described. The diodes have intrinsic regions of different thicknesses as compared to each other. In one example, the semiconductor structure includes an N-type silicon substrate, an intrinsic layer formed on the N-type silicon substrate, and a dielectric layer formed on the intrinsic layer. A number of openings are formed in the dielectric layer. Multiple anodes are sequentially formed into the intrinsic layer through the openings formed in the dielectric layer. For example, a first P-type region is formed through a first one the openings to a first depth into the intrinsic layer, and a second P-type region is formed through a second one of the openings to a second depth into the intrinsic layer. Additional P-type regions can be formed to other depths. In one embodiment, a semiconductor structure of diodes includes an N-type silicon substrate, an intrinsic layer on the N-type silicon substrate, a first P-type region formed to a first depth into the intrinsic layer, and a second P-type region formed to a second depth into the intrinsic layer. The first depth of the first P-type region is greater than the second depth of the second P-type region.

In one aspect, the semiconductor structure also includes a dielectric layer on the intrinsic layer, where the dielectric layer includes a plurality of openings. The first P-type region is formed through a first opening among the plurality of openings, and the second P-type region is formed through a second opening among the plurality of openings. A first width of the first opening is different than a second width of the second opening.

In another aspect, the semiconductor structure also includes a third P-type region formed to a third depth into the intrinsic layer, where the first depth is greater than the second depth, and the second depth is greater than the third depth. A number of additional P-type regions can also be formed to even greater depths into the intrinsic layer.

In another aspect, the semiconductor structure includes a cathode contact formed on the N-type silicon substrate at a backside of the semiconductor structure. The semiconductor structure also includes a first anode contact formed on the first P-type region at a frontside of the semiconductor structure, and a second anode contact formed on the second P-type region at the frontside of the semiconductor structure.

In another embodiment, a semiconductor structure of diodes includes a first pedestal comprising an N-type silicon substrate, an intrinsic layer on the N-type silicon substrate, and a first P-type region formed to a first depth into the intrinsic layer. The semiconductor structure of diodes also includes a second pedestal comprising the N-type silicon substrate, the intrinsic layer on the N-type silicon substrate, and a second P-type region formed to a second depth into the intrinsic layer. The semiconductor structure of diodes also includes an insulator formed between the first pedestal and the second pedestal. The first depth of the first P-type region is greater than the second depth of the second P-type region.

In one aspect, the semiconductor structure also includes a dielectric layer on the intrinsic layer, where the dielectric layer includes a plurality of openings. The first P-type region is formed through a first opening among the plurality of openings, and the second P-type region is formed through a second opening among the plurality of openings. A first width of the first opening is different than a second width of a second opening among the plurality of openings.

In another aspect, the semiconductor structure also includes a third pedestal comprising the N-type silicon substrate, the intrinsic layer on the N-type silicon substrate, and a third P-type region formed to a third depth into the intrinsic layer, wherein the insulator is formed between the first pedestal, the second pedestal, and the third pedestal. Additionally, the first depth is greater than the second depth, and the second depth is greater than the third depth. A number of additional pedestals, and P-type regions formed to even greater depths, can also be formed.

In another aspect, the semiconductor structure includes a first cathode contact formed on the N-type silicon substrate for the first pedestal at a backside of the semiconductor structure, and a second cathode contact formed on the N-type silicon substrate for the second pedestal at the backside of the semiconductor structure. The semiconductor structure also includes a first anode contact formed on the first P-type region at a frontside of the semiconductor structure, and a second anode contact formed on the second P-type region at the frontside of the semiconductor structure.

In another embodiment, a method of manufacture of a semiconductor structure is described. In one example, the method includes providing an N-type semiconductor substrate, providing an intrinsic layer on the N-type semiconductor substrate, forming an insulating layer on the intrinsic layer, forming a first opening in the insulating layer, implanting a first P-type region to a first depth into the intrinsic layer through the first opening in the insulating layer, forming a second opening in the insulating layer after implanting the first anode region, and implanting a second P-type region to a second depth into the intrinsic layer through the second opening in the insulating layer. The first depth is greater than the second depth in one example, and a first width of the first opening is different than a second width of the second opening. In one aspect, the method also includes, after implanting the second anode region, forming a third opening in the insulating layer, and implanting a third P-type region to a third depth into the intrinsic layer through the third opening in the insulating layer. Additional openings can be formed and P-type regions implanted.

In another embodiment, a semiconductor structure of diodes includes a P-type silicon substrate, an intrinsic layer on the P-type silicon substrate, a first N-type region formed to a first depth into the intrinsic layer, and a second N-type region formed to a second depth into the intrinsic layer. The first depth of the first N-type region is greater than the second depth of the second N-type region.

In one aspect, the semiconductor structure also includes a dielectric layer on the intrinsic layer, where the dielectric layer includes a plurality of openings. The first N-type region is formed through a first opening among the plurality of openings, and the second N-type region is formed through a second opening among the plurality of openings. A first width of the first opening is different than a second width of the second opening.

In another aspect, the semiconductor structure also includes a third N-type region formed to a third depth into the intrinsic layer, where the first depth is greater than the second depth, and the second depth is greater than the third depth. A number of additional N-type regions can also be formed to even greater depths into the intrinsic layer.

In another aspect, the semiconductor structure includes a contact formed on the P-type silicon substrate at a backside of the semiconductor structure. The semiconductor structure also includes a first contact formed on the first N-type region at a frontside of the semiconductor structure, and a second contact formed on the second N-type region at the frontside of the semiconductor structure.

In another embodiment, a semiconductor structure of diodes includes a first pedestal comprising a P-type silicon substrate, an intrinsic layer on the P-type silicon substrate, and a first N-type region formed to a first depth into the intrinsic layer. The semiconductor structure of diodes also includes a second pedestal comprising the P-type silicon substrate, the intrinsic layer on the P-type silicon substrate, and a second N-type region formed to a second depth into the intrinsic layer. The semiconductor structure of diodes also includes an insulator formed between the first pedestal and the second pedestal. The first depth of the first N-type region is greater than the second depth of the second N-type region.

In one aspect, the semiconductor structure also includes a dielectric layer on the intrinsic layer, where the dielectric layer includes a plurality of openings. The first N-type region is formed through a first opening among the plurality of openings, and the second N-type region is formed through a second opening among the plurality of openings. A first width of the first opening is different than a second width of a second opening among the plurality of openings.

In another aspect, the semiconductor structure also includes a third pedestal comprising the P-type silicon substrate, the intrinsic layer on the P-type silicon substrate, and a third N-type region formed to a third depth into the intrinsic layer, wherein the insulator is formed between the first pedestal, the second pedestal, and the third pedestal. Additionally, the first depth is greater than the second depth, and the second depth is greater than the third depth. A number of additional pedestals, and N-type regions formed to even greater depths, can also be formed.

In another aspect, the semiconductor structure includes a first contact formed on the P-type silicon substrate for the first pedestal at a backside of the semiconductor structure, and a second contact formed on the P-type silicon substrate for the second pedestal at the backside of the semiconductor structure. The semiconductor structure also includes a first contact formed on the first N-type region at a frontside of the semiconductor structure, and a second contact formed on the second N-type region at the frontside of the semiconductor structure.

In another embodiment, a method of manufacture of a semiconductor structure is described. In one example, the method includes providing a P-type semiconductor substrate, providing an intrinsic layer on the P-type semiconductor substrate, forming an insulating layer on the intrinsic layer, forming a first opening in the insulating layer, implanting a first N-type region to a first depth into the intrinsic layer through the first opening in the insulating layer, forming a second opening in the insulating layer after implanting the first anode region, and implanting a second N-type region to a second depth into the intrinsic layer through the second opening in the insulating layer. The first depth is greater than the second depth in one example, and a first width of the first opening is different than a second width of the second opening. In one aspect, the method also includes, after implanting the second anode region, forming a third opening in the insulating layer, and implanting a third N-type region to a third depth into the intrinsic layer through the third opening in the insulating layer. Additional openings can be formed and N-type regions implanted.

BRIEF DESCRIPTION OF THE DRAWINGS

Aspects of the present disclosure can be better understood with reference to the following drawings. It is noted that the elements in the drawings are not necessarily to scale, with emphasis instead being placed upon clearly illustrating the principles of the embodiments. In the drawings, like reference numerals designate like or corresponding, but not necessarily the same, elements throughout the several views.

DETAILED DESCRIPTION

Figure 1:
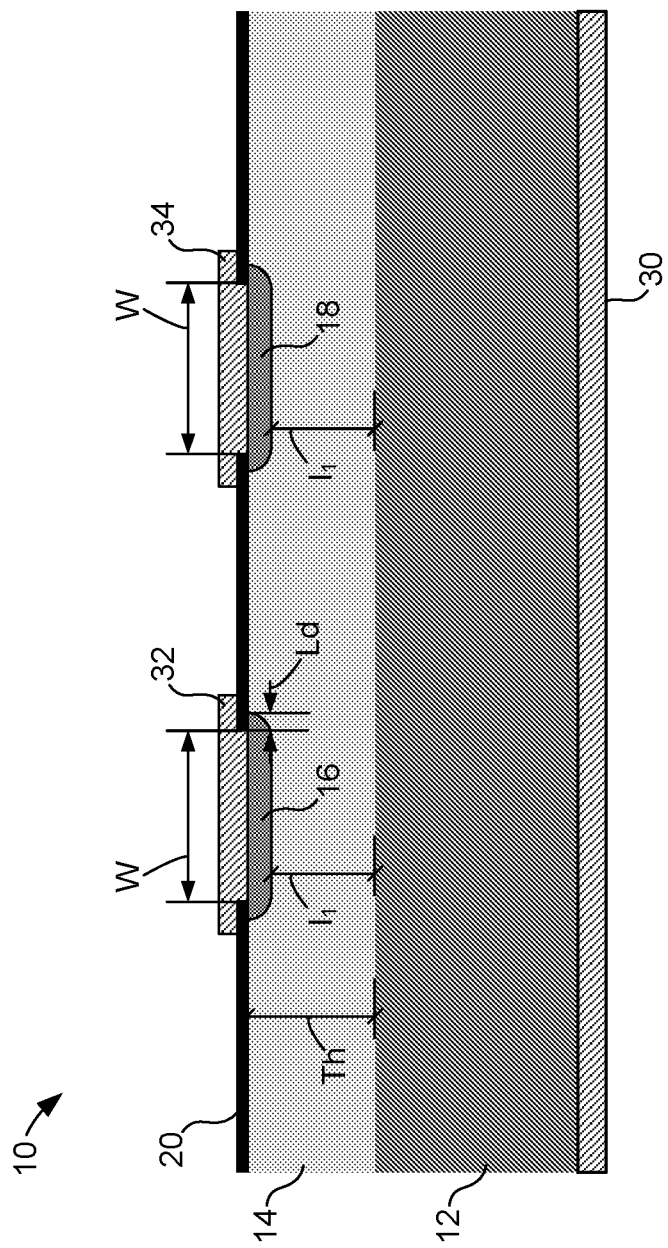
FIG. 1 illustrates an example vertical planar silicon PIN diode structure according to various embodiments described herein.

Current design and fabrication techniques for planar PIN diodes limit the types of diode structures that can be realized across a silicon wafer. For example, one fabrication technique for PIN diodes limits all the PIN diodes fabricated on a silicon wafer to each have the same "I" (i.e., intrinsic) region thickness. This is a result of several factors. First, PIN diodes are almost exclusively vertical structures, where a metallurgical "I" region is grown or wafer bonded over a highly doped N-type substrate, where he N-type substrate forms the N+ cathode. The P+ anode is then formed in the "I" region either by ion implantation or solid state deposition of a P-type dopant, followed by a heat cycle to activate and diffuse the P-type dopant to a specie depth into the "I" region. The junction depth of the P+ anode after the thermal drive cycle will result in a reduction of the metallurgical "I" region thickness resulting in an effective or electrical "I" region thickness. This approach results in a wafer and subsequent derivative die having an "I" region of only one thickness. In other words, every PIN diode formed through this approach has the same "I" region thickness. For many high frequency circuit functions, however, it is necessary to have PIN diodes with multiple "I" region thicknesses, to achieve a control response over a desired frequency range, for example, and for other operating characteristics.

Another example fabrication technique for PIN diodes is described in U.S. Pat. No. 7,868,428. U.S. Pat. No. 7,868, 428 describes the formation of multiple thickness "I" regions on a single wafer using a photolithographic process and lateral gaps between separate P+ and N+ regions. The P+ and N+ regions are ion implanted/diffused into an undoped intrinsic silicon wafer or intrinsic region of a wafer. The difficulty with this lateral surface controlled approach is the fact that relatively high surface leakage, which is in general at least 10 times the leakage levels observed for bulk, vertical devices, produces a very inconsistent turn-on characteristic.

In the context outlined above, a monolithic, vertical, planar semiconductor structure with a number of PIN diodes having different intrinsic regions is described. The PIN diodes have intrinsic regions of different thicknesses as compared to each other. The semiconductor structure includes an N-type silicon substrate, an intrinsic layer formed on the N-type silicon substrate, and a dielectric layer formed on the intrinsic layer. A number of openings are formed in the dielectric layer. Multiple anodes are sequentially formed into the intrinsic layer through the openings formed in the dielectric layer. For example, a first P-type region is formed through a first one the openings to a first depth into the intrinsic layer, and a second P-type region is formed through a second one of the openings to a second depth into the intrinsic layer. Additional P-type regions can be formed to other depths in the intrinsic layer. The approach results in a monolithic semiconductor structure having a number of different "I" region thicknesses among different PIN or NIP diodes. The diodes can also be integrated with other components, such as capacitors, resistors, and inductors on the monolithic semiconductor structure in a monolithic circuit format. The monolithic format can provide a number of advantages over conventional techniques where discrete diodes are used, such as smaller size, reduced cost, and better and more controllable frequency response.

FIG. 1 illustrates an example vertical planar silicon PIN diode structure 10 according to various embodiments described herein. The PIN diode structure 10 is illustrated as a representative example in FIG. 1. The shapes, sizes, and relative sizes of the various layers of the PIN diode structure 10 are not necessarily drawn to scale in FIG. 1. The layers shown in FIG. 1 are not exhaustive, and the PIN diode structure 10 can include other layers and elements not separately illustrated. Additionally, the PIN diode structure 10 can be formed as part of a larger integrated circuit device in combination with other diodes, capacitors, inductors, resistors, and layers of metal to electrically interconnect the circuit elements together to form switches, limiters, and other devices. A number of NIP diode devices can also be formed to have a structure similar to the PIN diode structure 10 shown in FIG. 1, by interchanging the P-type and N-type dopants described below.

The PIN diode structure 10 includes an N-type semiconductor substrate 12, an intrinsic layer 14, a first P-type region 16 formed in the intrinsic layer 14, and a second P-type region 18 formed in the intrinsic layer 14. The first and second P-type regions 16 and 18 are formed through openings of width "W" in an insulating layer 20 as described in further detail below. The N-type semiconductor substrate 12 forms a cathode of the structure 10. The P-type regions 16 and 18 form first and second anodes, respectively, of the structure 10. The PIN diode structure 10 also includes a cathode contact 30 formed on the N-type semiconductor substrate 12, a first anode contact 32 formed over the first P-type region 16, and a second anode contact 34 formed over the second P-type region 16.

The PIN diode structure 10 shown in FIG. 1 includes two PIN diode devices. Any suitable number of PIN diode devices can be formed in the PIN diode structure 10, however. Electrical contact to the first PIN diode device is available between the cathode contact 30 and the first anode contact 32. Electrical contact to the second PIN diode device is available between the cathode contact 30 and the second anode contact 34.

To form the PIN diode structure 10, the N-type semiconductor substrate 12 can be provided or formed by melting and mixing silicon with Arsenic, among other suitable dopants, to a concentration of about $2 \times 10^{19}$ Arsenic atoms/$cm^3$ and then solidifying the mixture, although the substrate 12 can be formed by other methods to other charge carrier concentrations. The intrinsic layer 14, which can be silicon in one example, can be formed over the substrate 12 using deposition, wafer bonding, or another suitable technique. The intrinsic layer 14 in FIG. 1 can have a thickness "Th" of between about 7-100 µm, in some cases, although the intrinsic layer 14 can be thicker (e.g., up to about 400 µm) in other cases.

The insulating layer 20 can be formed as a passivating dielectric layer of silicon dioxide, among other suitable dielectric insulators, on the upper surface of the intrinsic layer 14. The insulating layer 20 can have a thickness of between about 2000 Å and about 5000 Å and can be formed by oxidation in a furnace or reactor, local oxidation of the semi-conductor substrate, or other suitable process step(s). A number of openings can be formed in the insulating layer 20 by etching a positive photoresist mask using wet chemistry and/or the application of plasma, among other suitable methods. The openings can be formed to create the P-type regions 16 and 18. In FIG. 1, two openings of width "W" are shown in the insulating layer 20, but any suitable number of openings can be formed in the insulating layer 20. In other words, any suitable number of PIN diodes can be formed in the PIN diode structure 10.

The P-type regions 16 and 18 can both be formed at the top of the intrinsic layer 14 in one processing step, by ion implantation or solid source deposition of a high concentration of P-type dopant through the openings formed in the insulating layer 20. The P-type regions 16 and 18 can be formed in the same processing step by doping the intrinsic layer 14 with Boron, for example, to a concentration of about $2 \times 10^{19}$ atoms/cm$^3$, although other P-type dopants can be used to other charge carrier concentrations to form the junction. When the P-type regions 16 and 18 are formed, junctions are created between the P-type regions 16 and 18 and the intrinsic layer 14. The P-type regions 16 and 18 can be formed to a certain depth from the top surface into the intrinsic layer 14, such as to a depth of between about 2-5 μm. In the example shown in FIG. 1, both the P-type regions 16 and 18 are formed to the same depth of about 2-5 μm. When formed, the P-type regions 16 and 18 can laterally diffuse a certain distance, designated Ld in FIG. 1, under the insulating layer 20.

The P-type regions 16 and 18 are formed to the same depth in the intrinsic layer 14 in the example shown in FIG. 1. Thus, the intrinsic regions of the PIN diode devices are the same size. Particularly, the size of the effective intrinsic regions $I_1$, between the bottom of the P-type regions 16 and 18 and the top of the N-type semiconductor substrate 12, is the same. The intrinsic regions $I_1$ are between about 2-95 μm in the example shown.

Using the approach described above, the PIN diode structure 10 includes a number of PIN diode devices having the same (or nearly the same) thickness of intrinsic region. In other words, every PIN diode formed through this approach has the same effective "I" region thickness. For many high frequency circuit functions, however, it is necessary to have PIN diodes with multiple "I" region thicknesses, to achieve a control response over a desired frequency range, for example, and for other operating characteristics.

Thus, a new monolithic, vertical, planar semiconductor structure including a number of PIN diodes having different intrinsic regions is described below. A new monolithic semiconductor structure including a number of NIP diodes having different intrinsic regions is also described below. The diodes have intrinsic regions of different thicknesses as compared to each other. The diodes can also be integrated with other components, such as capacitors, resistors, and inductors on the monolithic semiconductor structure in a monolithic circuit format. The monolithic format can provide a number of advantages over conventional techniques where discrete diodes are used, such as smaller size, reduced cost, and better and more controllable frequency response.

Figure 2A:
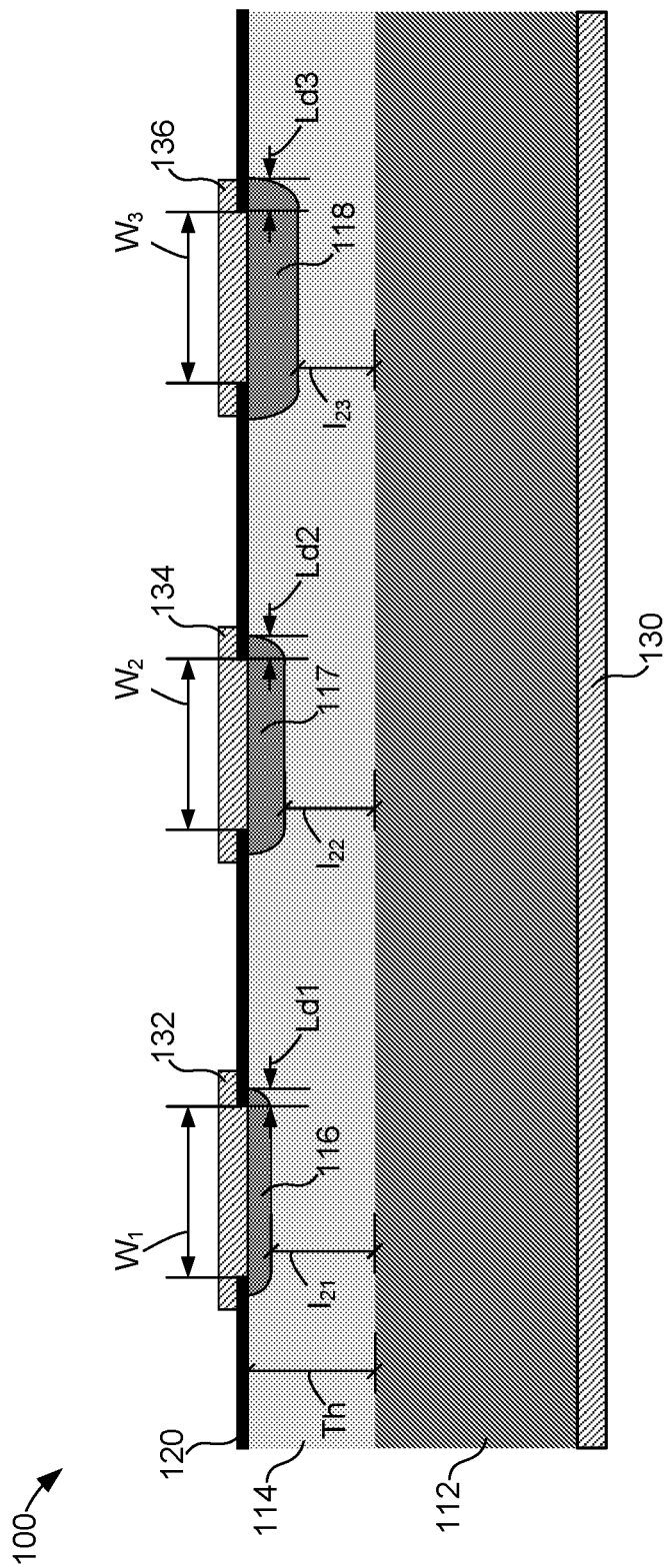
FIG. 2A illustrates an example vertical planar silicon PIN diode structure with multi-thickness intrinsic regions according to various embodiments described herein.

FIG. 2A illustrates an example vertical planar silicon PIN diode structure 100 with multi-thickness intrinsic regions according to various embodiments described herein. The PIN diode structure 100, including three PIN diode devices, is illustrated as a representative example in FIG. 2A. Additional PIN diode devices (i.e., more than three) can be formed as part of the PIN diode structure 100. The shapes, sizes, and relative sizes of the various layers of the PIN diode structure 100 are not necessarily drawn to scale in FIG. 2A. The layers shown in FIG. 2A are not exhaustive, and the PIN diode structure 100 can include other layers and elements not separately illustrated. The PIN diode structure 100 can also be formed as part of a larger integrated circuit device in combination with other diodes, capacitors, inductors, resistors, and layers of metal to electrically interconnect the circuit elements together to form switches, limiters, and other devices. Additionally, a number of NIP diode devices can also be formed to have a structure similar to the structure shown in FIG. 2A, by interchanging the P-type and N-type dopants described below.

The layers of the PIN diode structure 100 are similar to those shown for the PIN diode structure 10 of FIG. 1. However, in the example shown in FIG. 2A, each of the P-type anode regions is formed to a different depth in the intrinsic "I" layer or region. The PIN diode structure 100 includes an N-type semiconductor substrate 112, an intrinsic layer 114, a first P-type region 116 formed in the intrinsic layer 114, a second P-type region 117 formed in the intrinsic layer 114, and a third P-type region 118 formed in the intrinsic layer 114. The P-type regions 116-118 are formed through openings of widths $W_1$-$W_3$, respectively, in an insulating layer 120 as described in further detail below. The N-type semiconductor substrate 112 forms a cathode of the PIN diode structure 100. The P-type regions 116-118 form first, second, and third anodes, respectively, of the PIN diode structure 100. The PIN diode structure 100 also includes a cathode contact 130 formed on the N-type semiconductor substrate 112, a first anode contact 132 formed over the first P-type region 116, a second anode contact 134 formed over the second P-type region 117, and a third anode contact 136 formed over the third P-type region 118.

The PIN diode structure 100 shown in FIG. 2A includes three PIN diode devices, but the PIN diode structure 100 can be formed to include any suitable number of PIN diode devices. Electrical contact to the first PIN diode device is available between the cathode contact 130 and the first anode contact 132. Electrical contact to the second PIN diode device is available between the cathode contact 130 and the second anode contact 134. Electrical contact to the third PIN diode device is available between the cathode contact 130 and the third anode contact 136.

To form the PIN diode structure 100 shown in FIG. 2A, the P-type anode regions 116-118 can be formed sequentially, or in turn, in the intrinsic layer 114 as described below with reference to FIG. 2B. The P-type anode region 116 is diffused to the least extent into the intrinsic layer 114, the P-type anode region 117 diffused to a greater extent into the intrinsic layer 114, and the P-type anode region 118 is diffused the greatest extent into the intrinsic layer 114. Thus, the effective intrinsic region $I_{21}$ under the P-type anode region 116 is larger than the effective intrinsic region $I_{22}$ under the P-type anode region 117, and the effective intrinsic region $I_{22}$ is larger than the effective intrinsic region $I_{23}$ under the P-type anode region 118. In one example, the effective intrinsic region $I_{21}$ can be between about 20-23 μm, the effective intrinsic region $I_{22}$ can be about 12 μm, and the effective intrinsic region $I_{23}$ can be about 5 μm, although other ranges are within the scope of the embodiments.

The extent of the lateral diffusions, Ld1, Ld2, and Ld3 of the P-type regions 116-118 under the insulating layer 120 also vary, with the lateral diffusion Ld1 being the smallest and the lateral diffusion Ld3 being the largest. In some cases, to control the capacitance and the high-frequency characteristics of each individual PIN diode, the widths $W_1$-$W_3$ of the openings formed in the insulating layer 120 can vary as compared to each other. For example, $W_3$ can be smaller than $W_2$, and $W_2$ can be smaller than $W_1$.

Figure 2B:
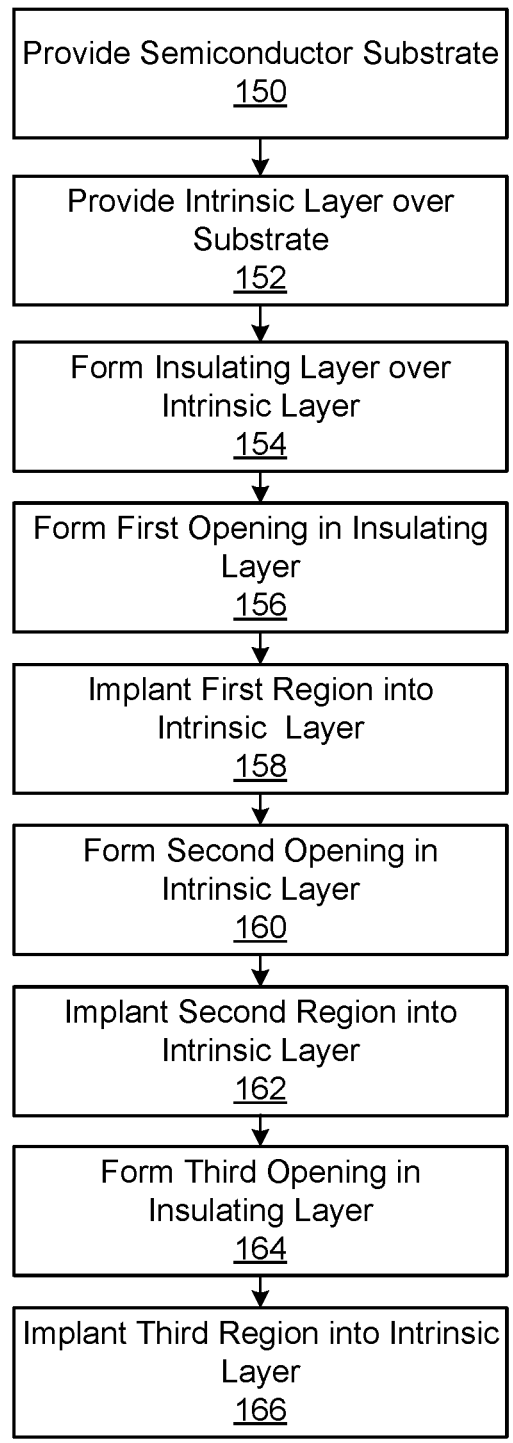
FIG. 2B illustrates an example method of forming the PIN diode structure shown in FIG. 2A according to various embodiments described herein.

FIG. 2B illustrates an example method of forming the PIN diode structure 100 shown in FIG. 2A. Alternatively, a NIP diode structure can also be formed using the method, by interchanging the P-type and N-type dopants, as described below. Although the method diagram illustrates a specific order in FIG. 2B, the order or the steps can differ from that which is depicted. For example, an order of two or more steps can be scrambled relative to the order shown in some cases. Also, two or more steps shown in succession can be performed, at least in part, at the same time. In some cases, one or more of the steps can be skipped or omitted. In other cases, additional steps not shown in FIG. 2B can be relied upon, such as steps among or after the steps shown in FIG. 2B.

At step 150, the process includes providing or forming the semiconductor substrate 112. The semiconductor substrate 112 can be formed by melting and mixing silicon with Arsenic, among other suitable dopants, to a concentration of about $2 \times 10^{19}$ Arsenic atoms/cm$^3$ and then solidifying the mixture, although the substrate 12 can be formed by other methods to other charge carrier concentrations. Additionally or alternatively, step 150 can include providing or sourcing the semiconductor substrate 112, such as when the semiconductor substrate 112 is sourced or purchased from a manufacturer. In another example, a NIP diode structure can be formed using the process shown in FIG. 2B. In that case, the process would include forming a P-type semiconductor substrate at step 150 using Boron, for example, or another P-type dopant rather than Arsenic.

At step 152, the process includes providing the intrinsic layer 114 over the semiconductor substrate 112. The intrinsic layer 114 can be provided or formed on the semiconductor substrate 112 using deposition, wafer bonding, or another suitable technique. The intrinsic layer 14 can have the thickness "Th" of between about 7-100 μm as shown in FIG. 2A, in some cases, although the intrinsic layer 14 can be thicker (e.g., up to about 400 μm) in other cases.

At step 154, the process includes forming the insulating layer 120 over the intrinsic layer 114. The insulating layer 120 can be formed over the intrinsic layer 114 by wet or dry oxidation in a furnace or reactor, local oxidation over the intrinsic layer 114, or other suitable process step(s). The insulating layer 120 can be formed as a passivating dielectric layer of silicon dioxide, among other suitable dielectric insulators, on the upper surface of the intrinsic layer 14. The insulating layer 120 can be formed to a thickness of between about 2000 Å and about 5000 Å, although other suitable thicknesses can be relied upon.

At step 156, the process includes forming a first opening in the insulating layer 120. Referring back to FIG. 2B, the opening of width $W_3$ can be formed at step 156. The opening of width $W_3$ can be formed in the insulating layer 120 by etching a positive photoresist mask using wet chemistry, the application of plasma, or using another suitable technique. No other openings are formed at step 156.

At step 158, the process includes implanting the P-type region 118 into the top of the intrinsic layer 114. The P-type region 118 can be formed by ion implantation or solid source deposition of a high concentration of P-type dopant through the opening formed in the insulating layer 120 at step 156. The P-type region 118 can be formed by doping the intrinsic layer 114 with Boron, for example, to a concentration of about $2 \times 10^{19}$ atoms/cm$^3$, although other P-type dopants can be used to other charge carrier concentrations to form the junction. When the P-type region 118 is formed, a junction is created between the P-type region 118 and the intrinsic layer 114.

Step 158 can also include thermally driving and diffusing the doping element for the P-type region 118 into the intrinsic layer 114. A rapid, high temperature, thermal processing or annealing process step can be used for thermal driving. The depth of the P-type region 118 and the size of the effective intrinsic region $I_{23}$ can be set by the high temperature thermal drive. In some cases, the thermal driving at step 158 is not relied upon, alone, to diffuse or drive the P-type region 118 to the full extent illustrated in FIG. 2A. In some cases, the thermal driving at steps 162 and 166 can also contribute to the diffusion of the P-type region 118 into the intrinsic layer 114, at least in part, as described below.

Alternatively, to form a NIP diode structure, step 158 can include implanting an N-type region into the top of the intrinsic layer 114. The N-type region can be formed by doping the intrinsic layer 114 with Arsenic, for example, or another suitable N-type dopant, to a suitable concentration. Step 158 can also include thermally driving and diffusing the N-type dopant into the intrinsic layer 114.

At step 160, the process includes forming a second opening in the insulating layer 120. Referring back to FIG. 2B, the opening of width $W_2$ can be formed at step 160. The opening of width $W_2$ can be formed in the insulating layer 120 by etching a positive photoresist mask using wet chemistry, the application of plasma, or using another suitable technique. No other openings are formed at step 160.

In some cases, the width $W_2$ can be the same as the width $W_1$. However, one consideration for the PIN diode structure 100 relates to the extent of lateral diffusion, Ld1, Ld2, and Ld3, that results during the high temperature thermal drives at steps 158, 162, and 166. As the junction depths of the P-type regions 116-118 increase, the lateral diffusions Ld1, Ld2, and Ld3 and the overall size of the resulting anodes also increase. In order to control the capacitance and the high-frequency characteristics of each individual PIN diode, the physical dimensions of the openings formed at steps 156, 160, and 164 can vary as compared to each other, to control the amount of the lateral diffusion. For example, $W_3$ can be formed smaller than $W_2$, and $W_2$ can be formed smaller than $W_1$.

At step 162, the process includes implanting the P-type region 117 into the top of the intrinsic layer 114. The P-type region 117 can be formed by ion implantation or solid source deposition of a high concentration of P-type dopant through the opening formed in the insulating layer 120 at step 160. The P-type region 117 can be formed by doping the intrinsic layer 114 with Boron, for example, to a concentration of about $2 \times 10^{19}$ atoms/cm$^3$, although other P-type dopants can be used to other charge carrier concentrations to form the junction. When the P-type region 117 is formed, a junction is created between the P-type region 117 and the intrinsic layer 114.

Step 162 can also include thermally driving and diffusing the doping element for the P-type region 117 into the intrinsic layer 114. A rapid thermal processing or annealing process step can be used for thermal driving. The depth of the P-type region 117 and the effective intrinsic region $I_{22}$ can be set by the high temperature thermal drive. In some cases, the thermal driving at step 162 is not relied upon, alone, to diffuse or drive the P-type region 117 to the extent illustrated in FIG. 2A. In some cases, the thermal driving at step 166 can also contribute to the diffusion of the P-type region 117 into the intrinsic layer 114, at least in part, as described below.

Ideally, the thermal driving of the P-type region 117 at step 162 would not impact or change the extent of the diffusion of the P-type region 118 into the intrinsic layer 114.

However, if this thermal restriction cannot be met, then the thermal budget for the thermal drive at step 158 must incorporate or account for the thermal drive at step 162. In other words, the thermal driving at step 162 can also contribute to the diffusion of the P-type region 118 further into the intrinsic layer 114 in some cases, and that diffusion can be accounted for when setting the thermal budget for the thermal drive at step 158.

Alternatively, to form a NIP diode structure, step 162 can include implanting an N-type region into the top of the intrinsic layer 114. The N-type region can be formed by doping the intrinsic layer 114 with Arsenic, for example, to a suitable concentration, although other N-type dopants can be used. Step 162 can also include thermally driving and diffusing the N-type dopant into the intrinsic layer 114.

At step 164, the process includes forming a third opening in the insulating layer 120. Referring back to FIG. 2B, the opening of width $W_3$ can be formed at step 164. The opening of width $W_3$ can be formed in the insulating layer 120 by etching a positive photoresist mask using wet chemistry, the application of plasma, or using another suitable technique. No other openings are formed at step 164.

At step 166, the process includes implanting the P-type region 116 into the top of the intrinsic layer 114. The P-type region 116 can be formed by ion implantation or solid source deposition of a high concentration of P-type dopant through the opening formed in the insulating layer 120 at step 164. The P-type region 116 can be formed by doping the intrinsic layer 114 with Boron, for example, to a concentration of about $2\times10^{19}$ atoms/cm$^3$, although other P-type dopants can be used to other charge carrier concentrations to form the junction. When the P-type region 116 is formed, a junction is created between the P-type region 116 and the intrinsic layer 114.

Step 166 can also include thermally driving and diffusing the doping element for the P-type region 116 into the intrinsic layer 114. A rapid thermal processing or annealing process step can be used for thermal driving. The depth of the P-type region 116 and the effective intrinsic region $I_{21}$ can be set by the high temperature thermal drive. In some cases, the thermal driving at step 166 can also contribute to the diffusion of the P-type regions 117 and 118 into the intrinsic layer 114, at least in part. Ideally, the thermal driving of the P-type region 116 at step 166 would not impact or change the extent of the diffusion of the P-type regions 117 and 118 into the intrinsic layer 114. However, if this thermal restriction cannot be met, then the thermal budgets for the thermal drive at steps 158 and 162 must incorporate or account for the thermal drive at step 166.

Alternatively, to form a NIP diode structure, step 166 can include implanting an N-type region into the top of the intrinsic layer 114. The N-type region can be formed by doping the intrinsic layer 114 with Arsenic, for example, to a suitable concentration, although other N-type dopants can be used. Step 166 can also include thermally driving and diffusing the N-type dopant into the intrinsic layer 114.

The process shown in FIG. 2B can also include process steps to form more windows and implant additional anodes in the PIN diode structure 10. Additional process steps, including backside processing steps, can also be relied upon to form the cathode contact 130 and the anode contacts 132, 134, and 136. Other steps can be relied upon to form components on the PIN diode structure 100, as part of a larger integrated circuit device including diodes, capacitors, inductors, resistors, and layers of metal to electrically interconnect the components together to form switches, limiters, and other devices.

FIGS. 2A and 2B encompass monolithic, vertical, planar semiconductor structures including a number of diodes having different intrinsic regions. The diodes have intrinsic regions of different thicknesses as compared to each other. The diodes can also be integrated with other components, such as capacitors, resistors, and inductors on the monolithic semiconductor structure in a monolithic circuit format. The monolithic format can provide a number of advantages over conventional techniques where discrete diodes are used, such as smaller size, reduced cost, and better and more controllable frequency response.

The concepts shown in FIGS. 2A and 2B can be extended to other types and arrangements of diode devices. For example, the cathodes of the diodes are electrically connected together in FIG. 2A, although the diodes (and the cathodes of the diodes) can be separated from each other in other example embodiments described below. Additionally, topside contacts can be formed for both the anodes and the cathodes of the diodes, and the backside contacts can be isolated for each diode, or even omitted in some cases, as described below.

Figure 3:
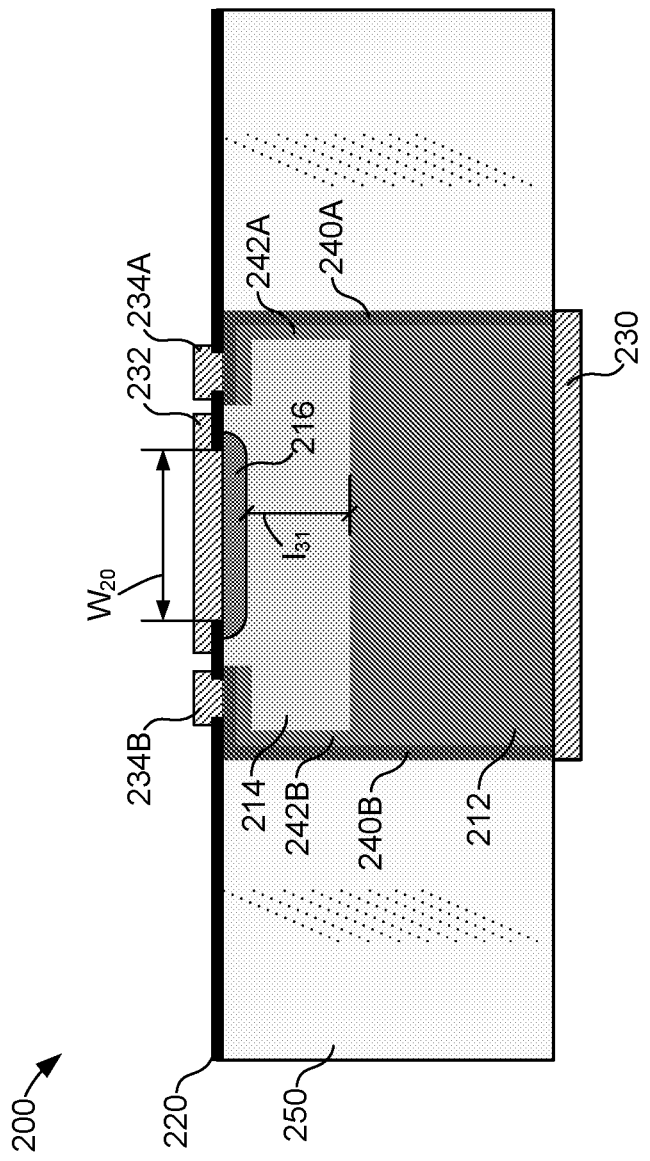
FIG. 3 illustrates an example HMIC silicon PIN diode structure according to various embodiments described herein.

Turning to other embodiments, FIG. 3 illustrates an example HMIC silicon PIN diode structure 200 according to various embodiments described herein. As compared to the diode structures 10 and 100 shown in FIGS. 1 and 2A, the diode structure 200 includes a highly insulative material, such as glass, to form a type of heterolithic microwave integrated circuit (HMIC). The PIN diode structure 200 is illustrated as a representative example in FIG. 3. The shapes and sizes of the layers of the PIN diode structure 200 are not necessarily drawn to scale. The layers shown in FIG. 3 are not exhaustive, and the PIN diode structure 200 can include other layers and elements not separately illustrated. Additionally, the PIN diode structure 200 can be formed as part of a larger integrated circuit device in combination with other diodes, capacitors, inductors, resistors, and layers of metal to electrically interconnect the circuit elements together to form switches, limiters, and other devices. In other embodiments, one or more NIP diodes can also be formed to have a structure similar to the structure shown in FIG. 3, by interchanging the P-type and N-type dopants.

The PIN diode structure 200 includes an N-type semiconductor substrate 212, an intrinsic layer 214, and a P-type region 216 formed in the intrinsic layer 214. These layers can be similar in form and size as compared to the corresponding layers in the structures 10 and 100, as shown in FIGS. 1 and 2A. The N-type semiconductor substrate 212 forms a cathode and the P-type region 216 forms an anode of the PIN diode structure 200. The P-type region 216 is formed through the opening of width $W_{20}$ in the insulating layer 220. The P-type region 216 can be formed to a depth of between about 2-5 µm in the intrinsic layer 214. With a 100 µm thick intrinsic layer 214, for example, the size of the effective intrinsic region $I_{31}$ can range between about 8-95 µm.

The PIN diode structure 200 includes a topside anode contact 232 formed over the P-type region 216. The PIN diode structure 200 also includes a backside cathode contact 230 and topside cathode contacts 234A and 234B. Metallic sidewall conductors 240A and 240B extend from and electrically connect the backside cathode contact 230 to the topside cathode contacts 234A and 234B, and N+-type doped sidewalls 242A and 242B insulate the metallic sidewall conductors 240A and 240B from the intrinsic layer 214.

As shown in FIG. 3, the N+-type doped sidewalls 242A and 242B and the metallic sidewall conductors 240A and 240B are formed along sidewalls of the intrinsic layer 214 and the substrate 212. The sidewalls of the intrinsic layer 214 and the substrate 212 are exposed through vertical etching of the intrinsic layer 214 and the substrate 212, which forms the intrinsic layer 214 and the substrate 212 into a type of pedestal as shown. The etching process step can be performed, in one example, after the P-type region 216 is formed but before the topside anode contact 232 and cathode contacts 234A and 234B are formed. Either a wet chemical etching or a dry etching technique can be relied upon to expose the sidewalls, as deep cavities can be obtained with either technique.

With a substrate 212 of sufficient thickness, the etching process can etch down through the intrinsic layer 214 and into the substrate 212 to a total depth of about 150-160 μm from a topside of the PIN diode structure 200. If wet chemical etching is relied upon, the sidewalls of the intrinsic layer 214 and the substrate 212 can extend down at an angle (e.g., at about 54.7 degrees) from the top surface of the PIN diode structure 200. If dry etching is relied upon, the sidewalls of the intrinsic layer 214 and the substrate 212 can extend substantially straight down (e.g., at an angle of about 90 degrees down from the top surface of the PIN diode structure 200).

The N+-type doped sidewalls 242A and 242B and the metallic sidewall conductors 240A and 240B can be formed after the etching. The N+-type doped sidewalls 242A and 242B can be formed by diffusing phosphorus, for example, or another N+-type dopant, into the exposed sidewalls of the intrinsic layer 214 and the substrate 212. The metallic sidewall conductors 240A and 240B can then be formed by depositing metal, such as cobalt silicide ($CoSi_2$), over the N+-type doped sidewalls 242A and 242B.

The insulator 250 can then be formed around the metallic sidewall conductors 240A and 240B and, if multiple diodes are formed, between the diodes. The application of the insulator 250 can start with a blanket deposition of about 1500 Å of silicon nitride, for example, by low pressure chemical vapor deposition (LPCVD), followed by the deposit of about 4000 Å of low temperature oxide (LTO). Those layers (although not shown in FIG. 3) can encapsulate and protect the diodes during the application of the insulator 250. The insulator 250 can then be fused into the area around the metallic sidewall conductors 240A and 240B, forming a conformal layer. The insulator 250 can be formed to a thickness of at least 50 μm higher than the depth of the vertical etch, to allow for a step of glass planarization.

The insulator 250 can be a borosilicate glass, for example, which exhibits a low dielectric constant, a low loss tangent, and a thermal coefficient of expansion similar to silicon for ruggedness over a broad temperature range, although other types of insulators can be relied upon. Although a single diode device is illustrated in FIG. 3, the insulator 250 can be relied upon to separate a number of different, side-by-side diode devices as described below with reference to FIGS. 5-7. The insulator 250 also permits a variety of different electrical connections among the diodes, by isolating them from each other.

After the insulator 250 is fused, a number of backside processing steps can be performed. A backside of the substrate 212 can be ground down until the insulator 250 is exposed. The backside cathode contact 230 can then be formed to extend over the metallic sidewall conductors 240A and 240B and the bottom side of the substrate 212. When formed, the backside cathode contact 230 is electrically connected to the metallic sidewall conductors 240A and 240B. The backside cathode contact 230 is then electrically connected to the topside cathode contacts 234A and 234B via the metallic sidewall conductors 240A and 240B. Thus, with the inclusion of the metallic sidewall conductors 240A and 240B and the topside cathode contacts 234A and 234B, both anode and cathode contacts are available on top of the PIN diode structure 200. As such, the PIN diode structure 200 is designed to facilitate shunt connections among diodes.

Figure 4:
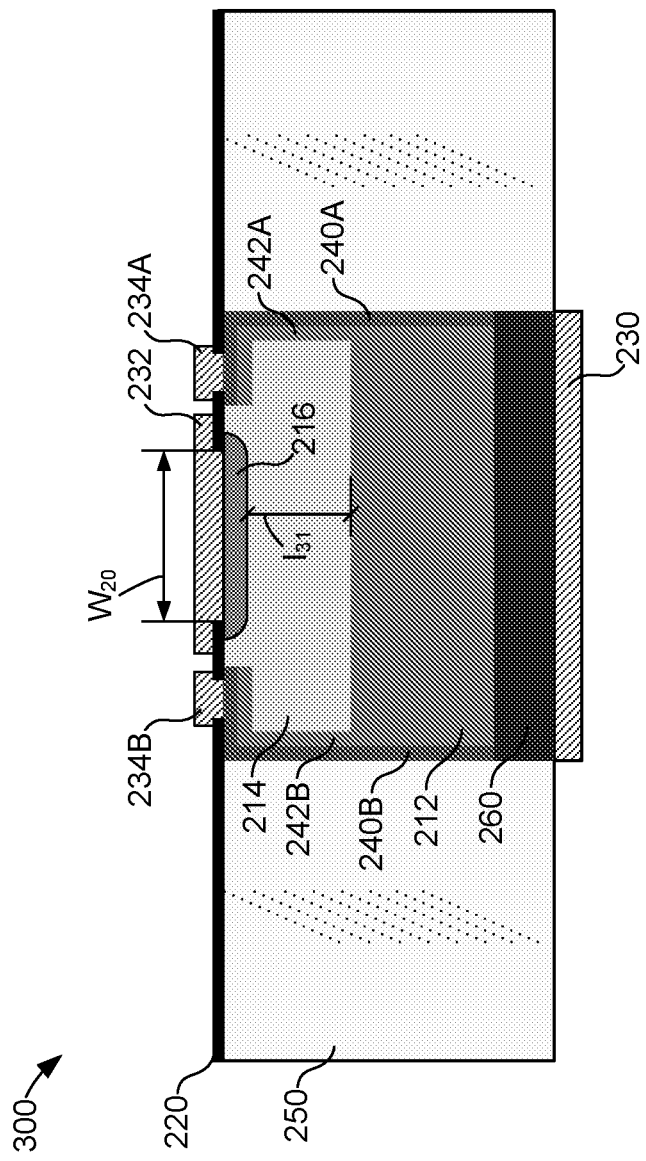
FIG. 4 illustrates another example HMIC silicon PIN diode structure according to various embodiments described herein.

In another embodiment, FIG. 4 illustrates an example HMIC silicon PIN diode structure 300. As compared to the PIN diode structure 300 shown in FIG. 3, the PIN diode structure 300 also includes an insulating material layer 260, such as boron nitride or a thermal epoxy, among other suitable insulators, between the N-type semiconductor substrate 212 and the backside cathode contact 230. The semiconductor substrate 212 can be etched from the backside of the semiconductor substrate 212 to a depth of about 50 μm, opening an area or void for the insulating material layer 260. Thus, the diode structure 300 is particularly suitable for series connections among diodes. The cathode contact 230 may be optionally included in the embodiment shown in FIG. 4 for the purpose of mechanical die attachment. In some cases, the cathode contact 230 can be omitted.

Both the PIN diode structure 200 shown in FIG. 3 and the PIN structure 300 shown in FIG. 4 can be extended to NIP structures. Additionally, both the PIN diode structure 200 and the PIN structure 300 can be extended to include a number of diodes with different "I" region thicknesses, in a monolithic format, as described below.

Figure 5A:
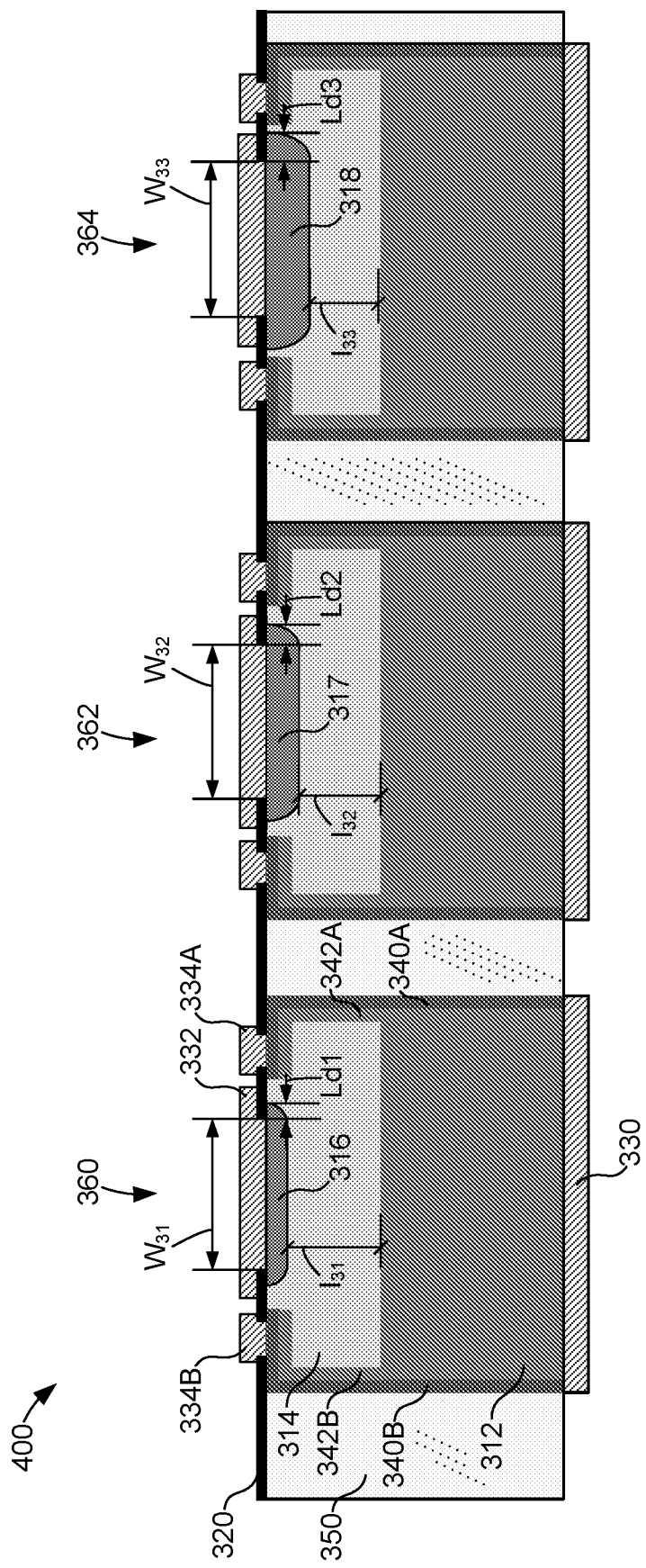
FIG. 5A illustrates another example HMIC silicon PIN diode structure with multi-thickness intrinsic regions according to various embodiments described herein.

FIG. 5A illustrates an example HMIC silicon PIN diode structure 400 according to various embodiments described herein. The PIN diode structure 400 is illustrated as a representative example in FIG. 5A. The shapes and sizes of the layers of the PIN diode structure 400 are not necessarily drawn to scale. The layers shown in FIG. 5A are not exhaustive, and the PIN diode structure 400 can include other layers and elements not separately illustrated. Additionally, the PIN diode structure 400 can be formed as part of a larger integrated circuit device in combination with other diodes, capacitors, inductors, resistors, and layers of metal to electrically interconnect the circuit elements together to form switches, limiters, and other devices. In other embodiments, one or more NIP diodes can also be formed to have a structure similar to the structure shown in FIG. 5A, by interchanging the P-type and N-type dopants.

The PIN diode structure 400 includes PIN diode devices 360, 362, and 364, formed as first, second, and third pedestals. The PIN diode device 360 includes an N-type semiconductor substrate 312 and an intrinsic layer 314, which are formed into a first pedestal by etching as described below. These layers are similar in vertical thickness as compared to the corresponding layers in the structure 200 shown in FIG. 3. A P-type region 316 is formed in the intrinsic layer 314. The N-type semiconductor substrate 312 forms a cathode and the P-type region 316 forms an anode of the PIN diode device 360. The P-type region 316 is formed through the opening of width $W_{31}$ in the insulating layer 320. The PIN diode devices 362 and 364 also include similar N-type semiconductor substrate and an intrinsic layers as shown, which are formed into first and second pedestals, respectively, by etching.

The PIN diode devices 362 and 364 are similar in form and size as compared to the PIN diode device 360. However, the P-type region 317 is diffused deeper than the P-type region 316, and the P-type region 318 is diffused deeper than the P-type region 317. To obtain that form, a method of manufacturing the PIN diode structure 400 can follow the process steps illustrated in FIG. 2B and described above.

Particularly, the P-type regions 316-318 can be formed sequentially, or in turn, in the intrinsic layer 314 according to the process steps shown in FIG. 2B. In that way, the P-type region 316 is diffused to the least extent into the intrinsic layer 314, the P-type region 317 diffused to a greater extent into the intrinsic layer 314, and the P-type region 318 is diffused the greatest extent into the intrinsic layer 314. Thus, the effective intrinsic region $I_{31}$ under the P-type region 316 is larger than the effective intrinsic region $I_{32}$ under the P-type region 317, and the effective intrinsic region $I_{32}$ is larger than the effective intrinsic region $I_{33}$ under the P-type region 318. In one example, the effective intrinsic region $I_{31}$ can be between about 20-23 µm, the effective intrinsic region $I_{32}$ can be about 12 µm, and the effective intrinsic region $I_{33}$ can be about 5 µm, although other ranges are within the scope of the embodiments.

The extent of the lateral diffusions, Ld1, Ld2, and Ld3 of the P-type regions 316-318 can also vary as described above, with the lateral diffusion Ld1 being the smallest and the lateral diffusion Ld3 being the largest. In some cases, to control the capacitance and the high-frequency characteristics of the PIN diode devices 360, 362, and 364, individually, the widths $W_{31}$-$W_{33}$ of the openings formed in the insulating layer 320 can vary as compared to each other. For example, $W_{33}$ can be smaller than $W_{32}$, and $W_{32}$ can be smaller than $W_{31}$.

The PIN diode device 360 includes a topside anode contact 332 formed over the P-type region 316. The PIN diode device 360 also includes a backside cathode contact 330 and topside cathode contacts 334A and 334B. Metallic sidewall conductors 340A and 340B extend from and electrically connect the backside cathode contact 330 to the topside cathode contacts 334A and 334B, and N+-type doped sidewalls 342A and 342B insulate the metallic sidewall conductors 340A and 340B from the intrinsic layer 314. These features can be similar in form and size as compared to the corresponding features in the structure 200 shown in FIG. 3. The PIN diode devices 362 and 364 can include similar features as shown in FIG. 5A.

The N+-type doped sidewalls 342A and 342B and the metallic sidewall conductors 340A and 340B are formed along sidewalls of the intrinsic layer 314 and the substrate 312 of the PIN diode device 360. The sidewalls of the intrinsic layer 314 and the substrate 312 are exposed through a vertical etching of the intrinsic layer 314 and the substrate 312 in a manner similar to that described above with reference to FIG. 3, but among all of the PIN diode devices 360, 362, and 364. The insulator 350 can then be formed around the metallic sidewall conductors 340A and 340B and the corresponding sidewall features of the PIN diode devices 362 and 364.

The application of the insulator 350 can start with a blanket deposition of silicon nitride by LPCVD, for example, followed by a deposit of LTO. Those layers (although not shown in FIG. 5A) can encapsulate and protect the PIN diode devices 360, 362, and 364 during the application of the insulator 350. The insulator 350 can then be fused into the etched areas around the PIN diode devices 360, 362, and 364, forming a conformal layer. The insulator 350 can be formed to a thickness of at least 50 µm higher than the depth of the vertical etch, to allow for a step of glass planarization. The insulator 350 can be a borosilicate glass, for example, which exhibits a low dielectric constant, a low loss tangent, and a thermal coefficient of expansion similar to silicon for ruggedness over a broad temperature range, although other types of insulators can be relied upon.

After the insulator 350 is fused, a number of backside processing steps can be performed. A backside of the substrate 312 can be ground down until the insulator 350 is exposed. The backside cathode contact 330 can then be formed to extend over the metallic sidewall conductors 340A and 340B and the bottom side of the substrate 312. When formed, the backside cathode contact 330 is electrically connected to the metallic sidewall conductors 340A and 340B. The backside cathode contact 330 is then electrically connected to the topside cathode contacts 334A and 334B via the metallic sidewall conductors 340A and 340B. The PIN diode structure 400 is designed to facilitate shunt connections among the PIN diode devices 360, 362, and 364.

Figure 5B:
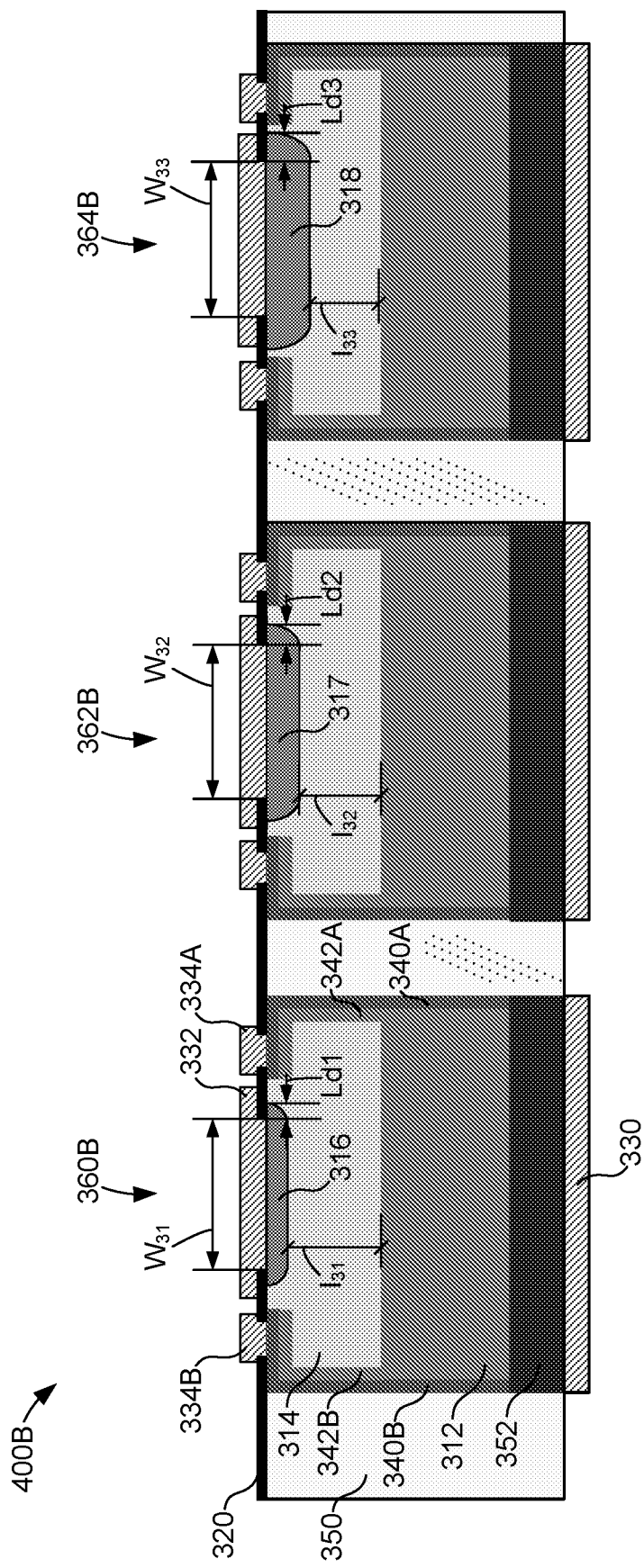
FIG. 5B illustrates another example HMIC silicon PIN diode structure with multi-thickness intrinsic regions according to various embodiments described herein.

FIG. 5B illustrates another example HMIC silicon PIN diode structure 400B according to various embodiments described herein. The PIN diode structure 400B includes PIN diode devices 360B, 362B, and 364B. The PIN diode structure 400B is similar to the PIN diode structure 400 shown in FIG. 5A. However, as compared to the PIN diode device 360 shown in FIG. 5A, the PIN diode device 360B in FIG. 5B also includes the insulating material layer 352, which is similar to the insulating material layer 260 in FIG. 4. The PIN diode device 362B and 364B also include similar insulating material layers. Thus, the PIN diode structure 400B is formed for series connections among the PIN diode devices 360B, 362B, and 364B. The cathode contacts, such as the cathode contact 330, may be optionally included in the embodiment shown in FIG. 5B for the purpose of mechanical die attachment. In some cases, the cathode contacts can be omitted.

Figure 6:
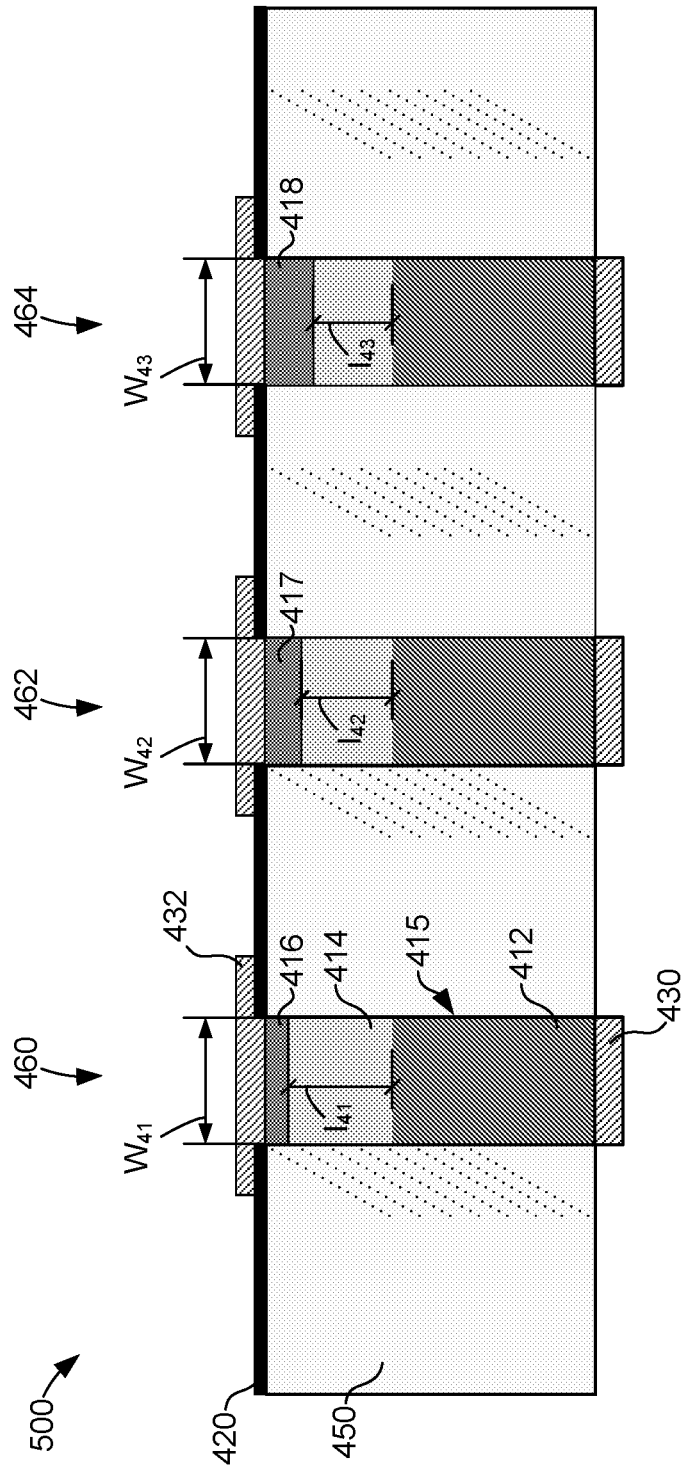
FIG. 6 illustrates another example HMIC silicon PIN diode structure with multi-thickness intrinsic regions according to various embodiments described herein.

FIG. 6 illustrates an example HMIC silicon PIN diode structure 500 according to various embodiments described herein. The PIN diode structure 500 is illustrated as a representative example in FIG. 6. The shapes and sizes of the layers of the PIN diode structure 500 are not necessarily drawn to scale. The layers shown in FIG. 6 are not exhaustive, and the PIN diode structure 500 can include other layers and elements not separately illustrated. Additionally, the PIN diode structure 500 can be formed as part of a larger integrated circuit device in combination with other diodes, capacitors, inductors, resistors, and layers of metal to electrically interconnect the circuit elements together to form switches, limiters, and other devices. In other embodiments, one or more NIP diodes can also be formed to have a structure similar to the structure shown in FIG. 6, by interchanging the P-type and N-type dopants.

The PIN diode structure 500 includes PIN diode devices 460, 462, and 464. The PIN diode device 460 includes an N-type semiconductor substrate 412, an intrinsic layer 414, and a P-type region 416 formed in the intrinsic layer 414. The N-type semiconductor substrate 412 forms a cathode and the P-type region 416 forms an anode of the PIN diode device 460. The P-type region 416 is formed through the opening of width $W_{41}$ in the insulating layer 420. The PIN diode device 460 includes a topside anode contact 432 formed over the P-type region 416. The PIN diode device 460 also includes a backside cathode contact 430.

The PIN diode devices 462 and 464 are similar in form and size as compared to the PIN diode device 460. However, the P-type region 417 is diffused deeper than the P-type region 416, and the P-type region 418 is diffused deeper than the P-type region 417. To obtain that form, a method of manufacturing the PIN diode structure 500 can follow the process steps illustrated in FIG. 2B and described above. Particularly, the P-type regions 416-418 can be formed sequentially, or in turn, in the intrinsic layer 414 according to the process steps shown in FIG. 2B. In that way, the P-type anode region 416 is diffused to the least extent into the intrinsic layer 414, the P-type region 417 diffused to a greater extent into the intrinsic layer 414, and the P-type region 418 is diffused the greatest extent into the intrinsic layer 414. Thus, the effective intrinsic region $I_{41}$ under the P-type region 416 is larger than the effective intrinsic region $I_{42}$ under the P-type region 417, and the effective intrinsic region $I_{42}$ is larger than the effective intrinsic region $I_{43}$ under the P-type region 418. In one example, the effective intrinsic region $I_{41}$ can be between about 20-23 µm, the effective intrinsic region $I_{42}$ can be about 12 µm, and the effective intrinsic region $I_{43}$ can be about 5 µm, although other ranges are within the scope of the embodiments.

Sidewall insulators 415 can also be formed along the sidewalls of the intrinsic layer 414 and the substrate 412 of the PIN diode device 460. The sidewall insulators 415 can include a passivating dielectric or oxide layer. To form the sidewall insulators 415, the sidewalls of the intrinsic layer 414 and the substrate 412 are exposed through vertical etching in a manner similar to that described above with reference to FIG. 3, but among all of the PIN diode devices 460, 462, and 464. The sidewall insulators 415 can then be formed on the sidewalls of the PIN diode device 460 and the corresponding sidewalls of the PIN diode devices 462 and 464, to ensure there are no vertical leakage paths between the anodes and the cathodes in those devices.

The insulator 450 can then be fused among the PIN diode devices 460, 462, and 464 in a manner similar to that described above. The application of the insulator 450 can start with a blanket deposition of silicon nitride by LPCVD, for example, followed by a deposit of LTO. Those layers (although not shown in FIG. 6) can encapsulate and protect the PIN diode devices 460, 462, and 464 during the application of the insulator 450. The insulator 450 can then be fused into the etched areas around the PIN diode devices 460, 462, and 464, forming a conformal layer. The insulator 450 can be formed to a thickness of at least 50 µm higher than the depth of the vertical etch, to allow for a step of glass planarization. The insulator 450 can be a borosilicate glass, for example, which exhibits a low dielectric constant, a low loss tangent, and a thermal coefficient of expansion similar to silicon for ruggedness over a broad temperature range, although other types of insulators can be relied upon.

After the insulator 450 is fused, a number of backside processing steps can be performed. A backside of the substrate 412 can be ground down until the insulator 450 is exposed. The backside cathode contact 430 can then be formed to extend over the bottom side of the substrate 412. In some cases, rather than forming a separate backside cathode contact for each of the PIN diode devices 460, 462, and 464 as shown in FIG. 6, a single backside cathode contact can be formed to extend across the N-type semiconductor substrates of all the PIN diode devices 460, 462, and 464. The PIN diode structure 500 is designed to facilitate shunt connections among the PIN diode devices 460, 462, and 464.

Because no topside cathode returns are needed for shunt configurations of PIN diodes, the approach shown in FIG. 6 can be relied upon to control the capacitance of the individual PIN diode devices 460, 462, and 464. In FIG. 6, the etching process is used to determine the physical dimensions of the P-type regions 416, 417, and 418, independent of the junction depths of the anodes and the sizes of the windows $W_{41}$-$W_{43}$ in the insulating layer 420. Thus, the concerns regarding the extent of the lateral diffusions, Ld1, Ld2, and Ld3 in the other embodiments can be controlled according to the approach shown in FIG. 6. In other words, the etching process is used to determine the physical dimensions of the P-type regions 416, 417, and 418, to control the capacitance and the high-frequency characteristics of each individual PIN diode.

The structures and methods described herein can be used to fabricate a wide variety of useful integrated circuits. For example, the PIN and NIP diodes described above can be integrated with various components in a monolithic circuit format suitable for microwave circuit applications. Although embodiments have been described herein in detail, the descriptions are by way of example.

The features of the embodiments described herein are representative and, in alternative embodiments, certain features and elements can be added or omitted. Additionally, modifications to aspects of the embodiments described herein can be made by those skilled in the art without departing from the spirit and scope of the present invention defined in the following claims, the scope of which are to be accorded the broadest interpretation so as to encompass modifications and equivalent structures.

Therefore, the following is claimed:

1. A semiconductor structure of diodes, comprising:
    an N-type silicon substrate;
    an intrinsic layer on the N-type silicon substrate, the intrinsic layer comprising an undoped silicon layer;
    a first P-type region for a first PIN diode, the first P-type region extending from a top surface of the intrinsic layer into the intrinsic layer and to a first depth in the intrinsic layer; and
    a second P-type region for a second PIN diode, the second P-type region extending from a top surface of the intrinsic layer into the intrinsic layer and to a second depth in the intrinsic layer, wherein the first depth is greater than the second depth.

2. The semiconductor structure according to claim 1, further comprising a dielectric layer on the intrinsic layer, the dielectric layer including a plurality of openings.

3. The semiconductor structure according to claim 2, wherein:
    the first P-type region is positioned under a first opening among the plurality of openings; and
    the second P-type region is positioned under through a second opening among the plurality of openings.

4. The semiconductor structure according to claim 2, wherein a first width of a first opening among the plurality of openings is different than a second width of a second opening among the plurality of openings.

5. The semiconductor structure according to claim 1, further comprising:
    a third P-type region for a third PIN diode, the third P-type region extending from a top surface of the intrinsic layer into the intrinsic layer and to a third depth in the intrinsic layer, wherein the second depth is greater than the third depth.

6. The semiconductor structure according to claim 1, further comprising a cathode contact on the N-type silicon substrate at a backside of the semiconductor structure.

7. The semiconductor structure according to claim 1, further comprising:
    a first anode contact for the first PIN diode on the first P-type region at a frontside of the semiconductor structure; and
    a second anode contact for the second PIN diode on the second P-type region at the frontside of the semiconductor structure.

8. A semiconductor structure of diodes, comprising:
a first pedestal for a first PIN diode, the first pedestal comprising an N-type silicon substrate, an intrinsic layer on the N-type silicon substrate, and a first P-type region extending from a top surface of the intrinsic layer into the intrinsic layer and to a first depth in the intrinsic layer, the intrinsic layer comprising an undoped silicon layer;
a second pedestal for a second PIN diode, the second pedestal comprising the N-type silicon substrate, the intrinsic layer on the N-type silicon substrate, and a second P-type region extending from a top surface of the intrinsic layer into the intrinsic layer and to a second depth in the intrinsic layer; and
an insulator between the first pedestal and the second pedestal, wherein the first depth is greater than the second depth.

9. The semiconductor structure according to claim 8, further comprising a dielectric layer on the intrinsic layer, the dielectric layer including a plurality of openings.

10. The semiconductor structure according to claim 9, wherein:
the first P-type region is positioned under a first opening among the plurality of openings; and
the second P-type region is positioned under a second opening among the plurality of openings.

11. The semiconductor structure according to claim 9, wherein a first width of a first opening among the plurality of openings is different than a second width of a second opening among the plurality of openings.

12. The semiconductor structure according to claim 8, further comprising:
a third pedestal for a third PIN diode, the third pedestal comprising the N-type silicon substrate, the intrinsic layer on the N-type silicon substrate, and a third P-type region extending from a top surface of the intrinsic layer into the intrinsic layer and to a third depth in the intrinsic layer, wherein:
the insulator is between the first pedestal, the second pedestal, and the third pedestal; and
the second depth is greater than the third depth.

13. The semiconductor structure according to claim 8, further comprising:
a first cathode contact for the first PIN diode on the N-type silicon substrate at a backside of the semiconductor structure; and
a second cathode contact for the second PIN diode on the N-type silicon substrate at the backside of the semiconductor structure.

14. The semiconductor structure according to claim 8, further comprising:
a first anode contact for the first PIN diode on the first P-type region at a frontside of the semiconductor structure; and
a second anode contact for the second PIN diode on the second P-type region at the frontside of the semiconductor structure.

15. A semiconductor structure of diodes, comprising:
an N-type silicon substrate;
an intrinsic layer on the N-type silicon substrate, the intrinsic layer comprising an undoped silicon layer;
a dielectric layer over the intrinsic layer, the dielectric layer including a plurality of openings;
a first P-type region for a first PIN diode, the first P-type region extending from a top surface of the intrinsic layer into the intrinsic layer and to a first depth in the intrinsic layer; and
a second P-type region for a second PIN diode, the second P-type region extending from a top surface of the intrinsic layer into the intrinsic layer and to a second depth in the intrinsic layer, wherein:
the first P-type region is positioned under a first opening among the plurality of openings;
the second P-type region is positioned under a second opening among the plurality of openings; and
the first depth is greater than the second depth.

16. The semiconductor structure according to claim 15, wherein a first width of the first opening is different than a second width of the second opening.

17. The semiconductor structure according to claim 15, further comprising:
a third P-type region for a third PIN diode, the third P-type region extending from a top surface of the intrinsic layer into the intrinsic layer and to a third depth in the intrinsic layer, wherein the second depth is greater than the third depth.

18. The semiconductor structure according to claim 15, further comprising:
a cathode contact on the N-type silicon substrate at a backside of the semiconductor structure;
a first anode contact for the first PIN diode on the first P-type region at a frontside of the semiconductor structure; and
a second anode contact for the second PIN diode on the second P-type region at the frontside of the semiconductor structure.

19. The semiconductor structure according to claim 15, further comprising an insulator between the first PIN diode and the second PIN diode.

20. The semiconductor structure according to claim 17, further comprising an insulator between the first PIN diode and the second PIN diode and between the second PIN diode and the third PIN diode.

* * * * *